US 7,405,555 B2

(12) United States Patent
Rao et al.

(10) Patent No.: US 7,405,555 B2
(45) Date of Patent: Jul. 29, 2008

(54) SYSTEMS AND METHODS FOR MEASURING LOCAL MAGNETIC SUSCEPTIBILITY INCLUDING ONE OR MORE BALANCING ELEMENTS WITH A MAGNETIC CORE AND A COIL

(75) Inventors: Kudumboor V. Rao, Stockholm (SE); Valter Ström, Stockholm (SE); Ziyan Gu, Kista (SE); Seetharama C. Deevi, Midlothian, VA (US)

(73) Assignee: Philip Morris USA Inc., Richmond, VA (US)

( * ) Notice: Subject to any disclaimer, the term of this patent is extended or adjusted under 35 U.S.C. 154(b) by 0 days.

(21) Appl. No.: 11/438,304

(22) Filed: May 23, 2006

(65) Prior Publication Data

US 2007/0063692 A1    Mar. 22, 2007

Related U.S. Application Data

(60) Provisional application No. 60/685,081, filed on May 27, 2005, provisional application No. 60/685,076, filed on May 27, 2005.

(51) Int. Cl.
*G01N 27/76* (2006.01)
*G01R 33/16* (2006.01)

(52) U.S. Cl. .................................... 324/201

(58) Field of Classification Search ............... 324/201, 324/207.25, 260, 228, 239
See application file for complete search history.

(56) References Cited

U.S. PATENT DOCUMENTS

| 3,492,566 | A | | 1/1970 | Gross |
| 3,742,344 | A | * | 6/1973 | Hummel .................... 324/201 |
| 3,879,658 | A | * | 4/1975 | Hummel .................... 324/201 |
| 6,046,585 | A | * | 4/2000 | Simmonds .................... 324/239 |
| 6,143,241 | A | | 11/2000 | Hajaligol et al. |
| 6,280,682 | B1 | | 8/2001 | Sikka et al. |
| 6,284,191 | B1 | | 9/2001 | Deevi et al. |
| 6,332,936 | B1 | | 12/2001 | Hajaligol et al. |
| 6,368,406 | B1 | | 4/2002 | Deevi et al. |
| 6,489,043 | B1 | | 12/2002 | Deevi et al. |
| 6,506,338 | B1 | | 1/2003 | Gedevanishvili et al. |
| 6,607,576 | B1 | | 8/2003 | Sikka et al. |

(Continued)

FOREIGN PATENT DOCUMENTS

AU    551709 B2    5/1986

(Continued)

OTHER PUBLICATIONS

Faley, M.I. et al., "High temperature superconductor dc SQUID micro-susceptometer for room temperature objects," *Supercond. Sci. Technol.*, 2004, pp. S324-S327, vol. 17.

(Continued)

*Primary Examiner*—Jay M Patidar
(74) *Attorney, Agent, or Firm*—Buchanan Ingersoll & Rooney PC

(57) ABSTRACT

A local magnetic susceptibility unit is adapted to measure the AC magnetic susceptibility of a surface region of a sample. The unit comprises a sensing element and one or more balancing elements arranged in a circuit. When a sample is placed proximate to the sensing element the sample induces an imbalance voltage in the circuit.

24 Claims, 4 Drawing Sheets

U.S. PATENT DOCUMENTS 6,746,508 B1 6/2004 Deevi et al.
6,927,570 B2 * 8/2005 Simmonds et al. .......... 324/239

FOREIGN PATENT DOCUMENTS

DE 258667 A1 7/1988
GB 2207510 A * 2/1989

OTHER PUBLICATIONS

Garcia-Oca, C. et al., "The Role of Carbon and Vacancies in Determining the Hardness of FeAl Intermetallic in the Quenched and the Aged Sates," *Mat. Res. Soc. Symp.*, 2001, pp. N3.1.1-N3.1.6, vol. 646.

Gedevanishvili, S. et al., "Processing of iron aluminides by pressureless sintering through FE + Al elemental route," *Mat. Sci. & Engineering*, 2002, pp. 163-176, A325, Elsevier Science B.V.

Morris, D.G. et al., "Evolution of microstructure and texture during industrial processing of FeAl sheets," *Mat. Sci. & Engineering*, 2002, pp. 573-581, A329-331, Elsevier Science B.V.

Noakes, D.R. et al., "Properties of incommensurate spin density waves in iron aluminides (invited)," *J. App. Physics*, Jun. 1, 2004, pp. 6574-6579, vol. 95, No. 11, American Inst. of Physics.

Pithawalla, Y.B. et al., "Synthesis of Magnetic Intermetallic FeAl Nanoparticles from a Non-Magnetic Bulk Alloy," *J. Phys. Chem. B*, Mar. 22, 2001, pp. 2085-2090, vol. 105, No. 11, Amer. Chemical Soc.

Reddy, B.V. et al., "Electronic structure and magnetism in $(FeAl)_n$ (n $\leq$ 6) clusters," *Chem. Phys. Ltrs.*, Jan. 26, 2001, pp. 465-470, 333, Elsevier Science B.V.

Sikka, Vinod K. et al., "Structural Applications for General Use," *Intermetallic Compounds*, 2002, pp. 501-518, vol. 3, *Principles and Practice*, Chapter 24, John Wiley & Sons, Ltd.

Gu, Ziyan, "Local Magnetic Susceptometry: Visualizing Functional Properties of Novel Materials," *KTH Industrial Eng. & Mgmt.*, Jun. 2005, Doctoral Thesis in Materials Science, Stockholm, Sweden (book included).

Reddy, B.V. et al., "Effect of size, disorder, and impurities on magnetism in FeAl," *Physical Review B Condensed Matter & Materials Physics*, Oct. 1, 2001, pp. 132408-1 to 132408-4, vol. 64, No. 13, The American Physical Society.

Takahashi, S. et al., "The influence of plastic deformation on the magnetic properties in Fe—Al alloys," *J. Phys.: Condens. Matter*, 1990, pp. 4007-4011, vol. 2, Abstract.

Takahashi, S. et al., "Superlattice dislocations and magnetic transition in Fe—Al alloys with the B2-type ordered structure," *J. Phys.: Condens. Matter*, 1991, pp. 5805-5816, vol. 3, Abstract.

Takahashi, S. et al., "Spin distribution in plastically deformed Fe—Al intermetallic compounds," *J. Phys.: Condens. Matter*, 1996, pp. 11243-11257, vol. 8, Abstract.

Takahashi, S. et al., "Spin distribution in plastically deformed Fe—Al intermetallic compounds II," *J. Phys.: Condens. Matter*, 1997, pp. 9235-9249, vol. 9, Abstract.

Yamashita K., "Formation of antiphase-boundary tubes and magnetization in Fe-35 at.% Al by plastic deformation at 77 K," *Taylor & Francis Group*, Aug. 1, 1998, pp. 285-303, vol. 78, No. 2, Abstract.

European Patent Office. International Search Report dated Jun. 12, 2006. International Application No. PCT/IB2006/002274. Applicant: Philip Morris Products S.A., 3 pages.

European Patent Office. PCT Written Opinion dated Jun. 12, 2006. International Application No. PCT/IB2006/002274. Applicant: Philip Morris Products S.A., 5 pages.

Bauman, John H. et al. "*Magnetic Susceptibility Meter for In Vivo Estimation of Hepatic Iron Stores.*" IEEE Transactions on Bio Medical Engineering, vol. BME-14, No. 4, pp. 239-243. Oct. 4, 1967.

* cited by examiner

SYSTEMS AND METHODS FOR MEASURING LOCAL MAGNETIC SUSCEPTIBILITY INCLUDING ONE OR MORE BALANCING ELEMENTS WITH A MAGNETIC CORE AND A COIL

This application claims priority under 35 U.S.C. 119 to U.S. Provisional Application No. 60/685,081, entitled Local Magnetic Susceptometer Unit, filed May 27, 2005, the entire content of which is hereby incorporated by reference. This application also claims priority under 35 U.S.C. 119 to U.S. Provisional Application No. 60/685,076, entitled Intermetallic Magnetically Readable Medium, filed May 27, 2005, the entire content of which is hereby incorporated by reference.

BACKGROUND

In the description that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art.

Magnetic susceptibility is the degree of magnetization of a material in response to a magnetic field. The dimensionless magnetic susceptibility is represented by the Greek symbol X. Materials having a positive magnetic susceptibility are paramagnetic. Paramagnetism is the tendency of the atomic magnetic dipoles in a material that is otherwise non-magnetic to align under the influence of an external magnetic field. This alignment of the atomic dipoles with the magnetic field tends to strengthen it.

Materials having a negative magnetic susceptibility are diamagnetic. Diamagnetism is a weak form of magnetism that is only exhibited in the presence of an external magnetic field. It is the result of changes in the orbital motion of electrons due to the external magnetic field. The induced magnetic moment is small and in a direction opposite to that of the applied field. When placed between the poles of a strong electromagnet, diamagnetic materials are attracted towards regions where the magnetic field is weak. Superconductors are perfect diamagnets. When a superconducting material is placed in an external magnetic field it will expel the field lines from its interior. Superconductors also have zero electrical resistance, which is a consequence of their diamagnetism.

Ferromagnetism is a phenomenon by which a material can exhibit a spontaneous magnetization, and is one of the strongest forms of magnetism. The magnetic susceptibility of a ferromagnetic substance is not linear. The response is dependent upon the state of the sample and can occur in directions other than that of the applied field. The differential susceptibility $X_{ij}=dM_j/dH_i$ expresses the susceptibility as a function of the derivatives of the components of the magnetization with respect to components of the applied field. The magnetization (M) of the material (the magnetic dipole moment per unit mass) and the applied field (H) are typically measured in Amperes per meter.

Magnetic property measurements can be used to characterize materials such as paramagnetic materials, diamagnetic materials, ferromagnetic materials, and superconducting materials. Typically, magnetic properties can be measured using either alternating electrical current (AC) or direct electrical current (DC) magnetic fields. AC susceptometers, for example, can detect the variation in flux created by placing a sample into an alternating magnetic field, and can measure as a function of frequency and/or temperature the complex susceptibility (X'+iX"), which comprises both a real component (X') and an imaginary component (X"). The imaginary component is related to the energy losses (e.g., energy absorbed) by the sample from the AC field.

SUMMARY

A local magnetic susceptibility measuring unit or "susceptometer" is provided to measure local magnetic properties and susceptibility of a local surface region of a sample. By measuring the susceptibility of a local surface region, a map of the magnetic susceptibility of the surface can be read from the surface. Thus, a susceptometer can be used to read a predetermined magnetic susceptibility pattern, which might otherwise not be readable without the susceptometer, such that patterns can be encoded and read only by a susceptometer, if so desired.

An exemplary susceptometer for measuring the AC magnetic susceptibility of a surface region of a sample includes a sensing element and one or more balancing elements arranged in a circuit, wherein the sensing element comprises a magnetic core having a leading arm and a trailing arm with a gap formed therebetween, and at least one coil wound around the magnetic core.

The unit can also include a power source adapted to energize at least one coil in the sensing element to create a magnetic field across the gap in the sensing element, and a phase sensitive detector adapted to measure an imbalance voltage in the circuit, wherein the susceptibility of a local surface region can be read by the sensing element in combination with the phase sensitive detector.

The sensing element can be mounted on a stage that is adapted to translate and/or rotate the sensing element with respect to a sample such that the local surface is readable by the susceptometer.

An exemplary sensing element is a magnetic head, such as a ferrite head, a ring head, a metal-in-gap head, or a thin film head.

In an exemplary circuit, the sensing element and the one or more balancing elements can include substantially identical elements and the sensing element can be located remotely from the balancing elements.

An exemplary sensing element can have a single gap, wherein the gap can have an area of less than 40,000 μm² or less than 1000 μm².

During the measurement of a sample, a sensing element and one or more balancing elements can be magnetically shielded.

A computer system can be used to control the power input to the circuit, motion and/or position of the sensing element, temperature of the sample, and/or acquisition and processing of AC magnetic susceptibility data.

An exemplary circuit can include a primary set of coils and a secondary set of coils such that the voltage from the secondary set of coils is zero when an alternating current flows through the primary set of coils and the gap of the sensing element is not proximate to the surface region of a sample.

In another exemplary embodiment, a circuit can include three balancing elements and a sensing element configured in a bridge circuit, wherein each element can include a single coil or a pair of coils connected in series via a center tap.

In yet another exemplary embodiment, a circuit can include a single balancing element having a first coil and a second coil, and a sensing element can include a first coil and a second coil such that the first coil of the sensing element and the first coil of the balancing element are connected in series or in parallel, and the second coil of the sensing element and the second coil of the balancing element are connected in series.

The susceptometer can be used to measure the in-plane AC magnetic susceptibility of a surface region of a sample. A method of measuring AC magnetic susceptibility can include passing an alternating electrical current through the circuit of the susceptometer, positioning a region of the sample proximate to the sensing element within a distance from the sensing element effective to induce a voltage perturbation in the circuit, and measuring a voltage perturbation in the circuit. The voltage perturbation can be measured using a phase sensitive detector. During the measurement, the sensing head and the balancing heads are preferably magnetically shielded.

A method of measuring an in-plane anisotropy of a sample can include rotating the sensing head with respect to the sample, measuring a voltage perturbation in the circuit, and storing the voltage perturbation signal as a function of the rotational position of the sensing head.

A method of mapping the AC magnetic susceptibility can include measuring the magnetic susceptibility at a plurality of points by changing the x position and/or the y position of the sensing element and storing a voltage perturbation signal as a function of an x and y position of the sensing element.

A background subtraction step can be used to calibrate the circuit by running a background subtraction algorithm when the sensing element is positioned at a distance from a sample ineffective to induce a voltage perturbation in the circuit.

The susceptometer can be used to detect magnetic features in a surface region of a sample.

DETAILED DESCRIPTION OF PREFERRED EMBODIMENTS

Figure 1:
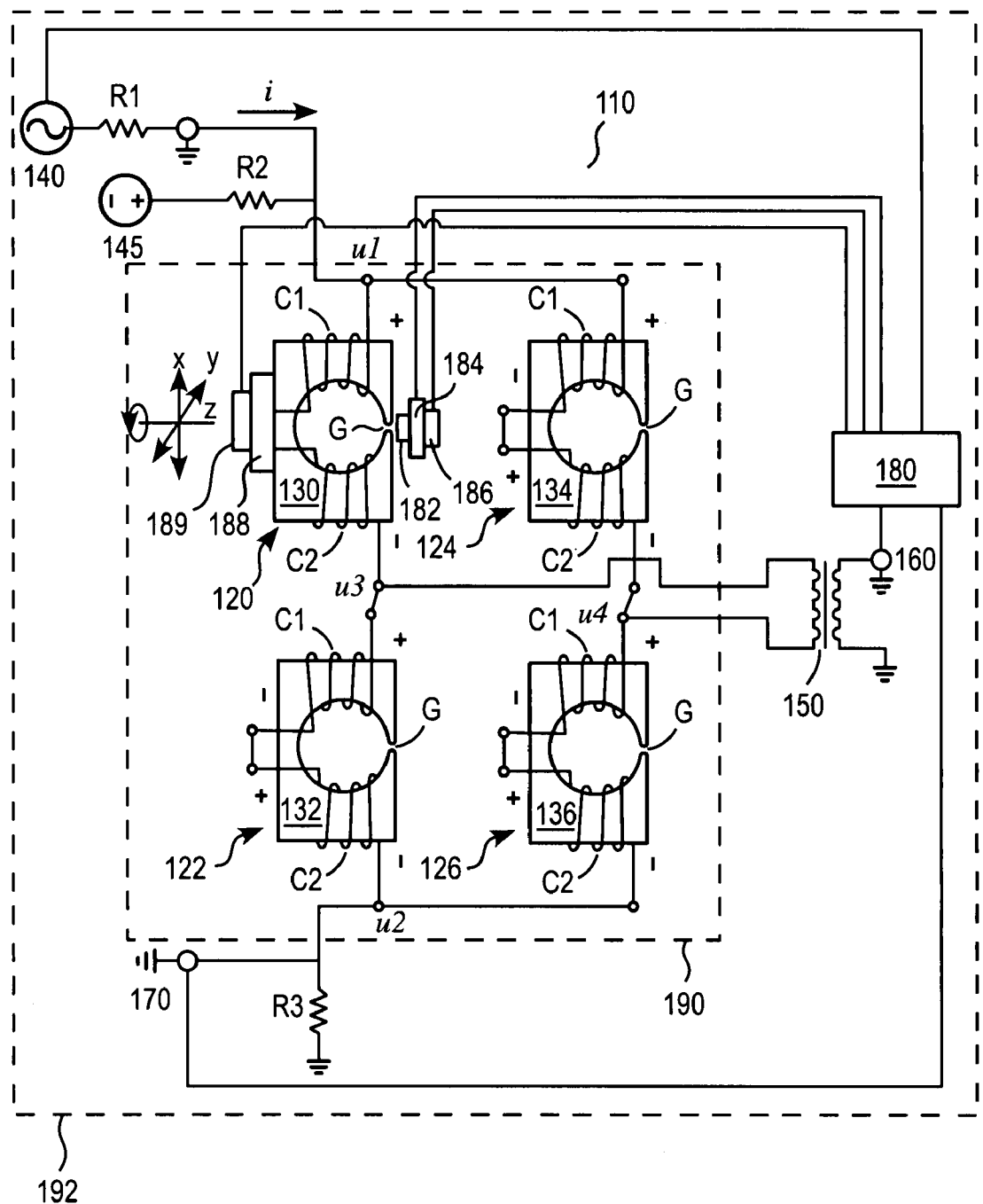
FIG. 1 is an illustration of the circuit diagram of a preferred embodiment of a 4-head bridge circuit.

A local magnetic susceptibility measuring unit or susceptometer (hereinafter "susceptometer") can be provided to measure and optionally map an alternating current (AC) magnetic susceptibility of a defined (i.e., localized) near-surface or surface region of a sample. As provided herein, exemplary susceptometers can be used to measure the magnetic susceptibility of thin film, bulk, and powder samples of hard and soft magnetic materials, electrically conductive materials and superconductors.

In order to measure magnetic susceptibility, a susceptometer can be provided to move around a sample or to move a sample within the susceptometer. Thus, exemplary susceptometers can be small or large in size. Additionally, if the susceptometer is small, it can be made portable (e.g., handheld or suitable for use on a desk top) or if the susceptometer is large, it can be made as a stationary device, as desired.

In exemplary embodiments, a susceptometer can include a bridge circuit preferably having a single active sensing element. The sensing element can be arranged with one or more balancing (i.e., compensating) elements to form a circuit with no internal offset voltage when a sample is not incorporated in the circuit. The sensing element can be a magnetic head and the balancing elements can also be magnetic heads or their circuit equivalents. The sensing element and the balancing elements of exemplary bridge circuits can include substantially identical ring heads or substantially identical thin film heads, wherein ring heads and thin film heads can be magnetic heads.

In embodiments where the sensing element and the balancing elements are magnetic heads, each head in the bridge circuit includes a magnetic core (i.e., magnetic conduction body) having a leading arm and a trailing arm with a gap (i.e., head gap) formed therebetween. In each of these circuits, one or more coils can be wound around the magnetic core, which can be made of a magnetic material, such as a permalloy alloy or a ferrite alloy, in order to form the circuit.

In an exemplary embodiment, a magnetic field from a sensing head can interact with a near-surface region of a sample, wherein the sample can induce an imbalance voltage in a bridge circuit through an interaction between the sample and the sensing head. It is noted that the measurement of the AC susceptibility is based on an induced change in the mutual inductance and resistance of the one or more coils within the sensing head.

In operation, AC having a given frequency (i.e., the driving frequency) can be passed through a bridge circuit causing current flow through the coils within the heads. By flowing current through the coils within the head, a magnetic field can be created across and proximate to the gap of each head.

When a sample lies within the magnetic field of a sensing head, a region of the sample can induce a flux variation in the magnetic field across a sensing head gap. This flux variation can in turn induce an imbalance voltage (secondary voltage), as mentioned above, in the bridge circuit according to Faraday's law. Thus, when a sample is placed proximate to the coils, a measurable imbalance voltage in the bridge circuit can be read, and thus the magnetic susceptibility of a local surface region of a sample can be read. Additionally, when a sample is not placed proximate to the coils of the sensing head (i.e., when the sample is not placed within an effective distance of the sensing head to induce an imbalance voltage in the bridge circuit), the bridge circuit can be balanced and can be read as zero. Thus, susceptibility measurements can be made within a proximate distance from the coils.

In exemplary embodiments, a susceptometer can be a non-contact or a contact apparatus. That is, the magnetic susceptibility of a sample can be measured by positioning the sensing head proximate to (i.e., not in contact) or in contact with a surface of the sample provided that the susceptometer is within a sufficient proximate distance to induce a measurable imbalance voltage.

This imbalance voltage can be measured by a detector such as a phase sensitive detector or a lock-in amplifier. More specifically, a lock-in amplifier can be used to measure the phase content of the imbalance voltage at the driving frequency. The detector, in turn, can produce an output proportional to the magnetic susceptibility of a sample.

In exemplary embodiments, a susceptometer can be used to spatially quantify magnetic susceptibility of a sample, wherein a sensing head of the susceptometer can measure the magnetic susceptibility from a localized region of a sample. For example, a sensing head can be moved (i.e., translated) across a surface of a sample to measure the magnetic susceptibility of the sample.

In one embodiment, a map of the magnetic susceptibility, which can comprise a 2D (areal) or 3D map, can be obtained by stepping a sensing head over a surface of a sample and measuring the magnetic susceptibility at each step. To map the magnetic susceptibility, data can be acquired from a plurality of discrete locations across a surface of a sample by moving the sensing head.

According to an exemplary method of measuring the local magnetic susceptibility, a sensing head can be positioned proximate to (or in contact with) a sample surface at a first location and an induced response in the bridge circuit can be measured at the first location. Next, the sensing head can be re-positioned proximate to (or in contact with) the sample surface at a second location, where the induced response in the bridge circuit is measured at the second location. From the induced responses in the first and second locations, a magnetic susceptibility map of the sample surface can be obtained for these two locations. Additionally, by repeating this process of repositioning the sensing head and measuring the induced response at a plurality of sample locations, a more complete magnetic susceptibility map can be attained for the sample surface.

It is noted that as an alternative to moving the sensing head with respect to the sample, the sample can be moved with respect to the sensing head, as desired. For example, if the sample is large or the susceptometer is small, moving the susceptometer might be better; whereas if the sample is small or the susceptometer is large, moving the sample might be better.

In order to regulate magnetic susceptibility measurements and/or account for environmental interferences, such as environmental electromagnetic radiation and/or local temperature gradients, a background subtraction step can be performed. According to an exemplary method of measuring susceptibility, a background subtraction step can be performed each time a measurement is performed (e.g., each time the sensing head is repositioned).

Background subtraction can be performed, for example, by physically withdrawing the sensing head from the sample surface (i.e., withdrawing the sensing head to a distance from the sample effective to remove the sample from the magnetic field of the sensing head) and running a computer algorithm to calibrate a bridge circuit of the susceptometer. Alternatively, background subtraction can be performed, for example, by calibrating a bridge circuit prior to introduction of the sample to the susceptometer.

After measuring imbalance voltage data (i.e., data as a function of position) for a sample, the data can be output to a device, such as a printer or a computer, for later use (i.e., mapping). For example, the signals can be interfaced to a computer that can store the signals as a function of the spatial position of the sensing head with respect to the sample. As a further example, signals can be interfaced to a computer or display device that can produce an output for characterizing a sample.

According to another exemplary embodiment, a sensing head can be rotated with respect to a surface of the sample for reading magnetic anisotropy. For example, magnetic anisotropy data can be obtained by rotating a sensing head with respect to a defined area of a sample and measuring a voltage perturbation as a function of the rotation. By rotating the sensing head, a 2D or 3D map of the magnetic anisotropy in terms of susceptibility can be mapped. It is noted that a background subtraction step can be performed, if desired, each time (or at predetermined alternative iterations) the sensing head is rotated to a new orientation with respect to the sample (or the sample is moved to a new orientation with respect to the sample head).

The applied AC field can also be used in combination with an exemplary susceptometer to investigate linear and non-linear magnetic properties. For example, a susceptometer can be used to simultaneously measure both a real (in-phase) component and an imaginary (out-of-phase) component of magnetic susceptibility to determine linear and non-linear magnetic properties. For example, a susceptometer can be used to generate a polar plot of the magnetic anisotropy (e.g., in-phase and out-of-phase magnetic susceptibility) of a region of the sample's surface.

In an exemplary embodiment, a susceptometer includes an active sensing head and one or more balancing heads. The sensing head and the one or more balancing heads can be arranged in a bridge circuit, which in turn can include a power source to provide an alternating electrical current to the bridge circuit at a given frequency and voltage. Additionally, an output voltage (imbalance voltage) of a bridge circuit can be fed to a detector, such as a lock-in amplifier, via an optional step-up transformer. As explained in more detail below, the sensing head 120 and the one or more balancing heads 122, 124, and 126 can be magnetically shielded and the sensing head 120 can be mounted on a stage 168 that is adapted to translate and/or rotate the sensing head 120 with respect to a sample 182.

In another exemplary embodiment, a susceptometer includes stepper motors 189 adapted to control the motion and position (e.g., $\theta$, x, y and z) of a sensing head 120 with respect to a surface of sample. Thus, the susceptibility can be mapped using the stepper motors 189 based upon a desired position.

In an exemplary embodiment, a sample 182 in a susceptometer 110 can be temperature controlled. For example, a sample 182 in the susceptometer 110 can be mounted on a temperature-controlled sample stage 184, such as a cryogenic sample stage. As an alternative to a temperature-controlled sample stage, a temperature-controlled bath, such as a cryogenic bath, can be provided. Additionally, a temperature controller 186 can be provided to control the temperature of the sample stage 184 or the bath, if desired.

Additionally, a sample stage can be mounted on a damped platform to reduce vibrations from the environment, as well as vibrations from the stepper motors, if desired. If a damped platform is provided, then vibration related errors can be reduced and a more accurate reading can be attained especially if a stepped motor is provided in the susceptometer.

Also, a controller unit, such as a computer with suitable software, can be provided to control the power source, motion of the sensing head, temperature of the sample stage, data acquisition and analysis, etc.

Various configurations of sample stages and stepper motors can be used for exemplary susceptometers. In a first exemplary configuration, a sample can be mounted on a sample stage that is in turn mounted directly on an x-y table. According to the first configuration, the x-y table can be used to move the sample stage, thus configuring the susceptometer to move the sample with respect to the sensing head.

In a second exemplary configuration, a sample can be mounted on a sample stage while stepper motors can be configured to control the motion of the sensing head. In contrast to the first configuration where the sample stage is adapted to be translated by the stepper motors, the sample stage of the second configuration can be adapted to remain substantially fixed in space. According to the second configuration, which advantageously can include a free area adjacent to the sample, stepper motors can translate (i.e., in the x and y directions) and or rotate (in the $\theta$ direction) the sensing head with respect to the sample.

Various circuit configurations of the sensing head and the one or more balancing heads can be used. A first configuration is a 4-head geometry in which four identical ring heads are connected in a bridge circuit. In the 4-head geometry, each head preferably comprises a single coil (or two coils connected in series with a center tap).

A basic circuit of a 4-head geometry is shown in FIG. 1. An exemplary bridge circuit 110 is provided which includes four identical ring heads 120, 122, 124 and 126. Each of the four ring heads can include a pair of coils C1, C2 connected via a center tap, wherein each pair of coils can be wound in series around the leading and trailing arms of magnetic cores 130, 132, 134, 136 such that a negative pole of a first coil C1 is connected to a positive pole of a second coil C2 within each head. Thus, within each head having a pair of coils connected with a center tap, a negative pole of one coil (C1) can be connected to a positive pole of the other coil (C2).

As further illustrated in FIG. 1, each magnetic core can be shaped to form a gap G.

As also illustrated in FIG. 1, sensing head 120 and first balancing head 122 form a primary set, while second and third balancing heads 124 and 126 form a secondary set. Details of magnetic heads suitable for use in the susceptometer are disclosed by M. Camras in "The Magnetic Recording Handbook," Van Nostrand Reinhold Company, NY (1988), the contents of which are hereby incorporated by reference. The bridge circuit further comprises resistors R1, R2 and R3.

In operation, a sinusoidal magnetic field of a given frequency can be created across the gap of each head by a current output of a power source 140, such as an oscillator. The output of the power source 140, which can be an AC current of known voltage and frequency, can be used to energize each coil pair C1, C2. Optionally, a DC power source 145 can be connected to a bridge circuit 110. Additionally, an optional DC signal can be superimposed on the AC signal and can be used to energize the coils C1, C2 within the bridge circuit. The bridge circuit can also be connected to a differential input of a computer-controlled lock-in amplifier 160, which in turn can be used as an off-balance meter, if desired.

The alternating current supplied by the power source 140 to the bridge circuit is preferably less than about 100 mA (e.g., about 10, 20, 30, 40, 50, 60, 70, 80 or 90 mA), more preferably less than about 40 mA; the voltage is preferably less than 10V (e.g., about 1, 2, 3, 4, 5, 6, 7, 8 or 9 V); and the frequency is preferably less than about 1 MHz, more preferably less than about 500 kHz (e.g., about 1, 2, 5, 10, 20, 50, 100, 200 or 500 kHz).

Referring still to FIG. 1, the voltages at particular locations within the bridge circuit are designated u1, u2, u3 and u4. At a location in the circuit between the power source 140 and heads 120,124, the voltage is u1, and at a location between heads 122,126 and ground, the voltage is u2. Further, the voltage across the primary set is u3 and the voltage across the secondary set is u4.

When the bridge circuit is empty (i.e., there is no sample incorporated into the bridge circuit), the voltage drop across each (identical) head is equal, and the off-balance voltage (i.e., u3-u4) between the primary set and the secondary set is zero. In other words, in an empty or no sample condition, (u1-u3)=(u1-u4)=(u3-u2)=(u4-u2)=½(u1-u2) and (u3-u4)=0.

In operation, gap G of the sensing head faces the surface of a sample when a local magnetic susceptibility is measured by an energized sensing head 120. When the gap G of an energized sensing head 120 is placed proximate to the sample, magnetic field lines from the sensing head 120 can interact with and/or penetrate a local region of the sample surface. It is noted that in exemplary embodiments, the area of interaction, from which the magnetic susceptibility is measured, is approximately the area of the gap in the sensing head.

According to a preferred embodiment, the susceptometer can measure a sample area of less than 40,000 $\mu m^2$, more preferably less than 2500 $\mu m^2$, most preferably less than 1000 $\mu m^2$. The volume of interaction V can be approximated as the cross sectional area of the gap (i.e., gap length×gap width) multiplied by the effective depth of penetration into the sample by the magnetic field lines of the sensing head (i.e., V=gap length×gap width×depth of penetration). Typically, the depth of penetration, which is a function of the strength of the magnetic field and the magnetic properties of the sample, can be up to about 1 micrometer. Thus, a susceptometer can measure the magnetic susceptibility of the near-surface or surface region of a sample up to a depth of about 1 micrometer.

It is noted that because the field lines from a gap of the sensing head can run substantially parallel to the surface of the sensing head, an applied magnetic field can be substantially parallel to the sample surface. The measured response, which can be co-planar and parallel to the applied field, can therefore provide a substantially in-plane, near surface, localized measurement of the magnetic susceptibility.

When a sample is positioned within a magnetic field of the sensing head, an off-balance AC voltage equal to (u3-u4) can be induced in the bridge circuit according to Faraday's Law. Faraday's Law states that a change in the magnetic environment of a coil of wire will cause a voltage (i.e., electromotive force) to be induced in the coil.

This voltage, which in the susceptometer is the "off-balance voltage," can be measured using a lock-in amplifier 160, such as a Stanford Research Systems Model SR830 digital phase shifting (DSP) lock-in amplifier manufactured by Stanford Research Systems of Sunnyvale, Calif. Briefly, a lock-in amplifier as used herein, can include a phase sensitive detector (PSD) that can perform an AC to DC conversion in which a signal of interest (e.g., the off-balance voltage) can be rectified while extraneous signals can be suppressed. Thus, in order to "lock-in" a particular signal, a lock-in amplifier can be supplied with a reference voltage of the same frequency and with a fixed phase relationship to that of the desired signal. Preferably, the reference signal is taken from the output of power source 140.

Exemplary lock-in amplifiers can include two channels, wherein signals at each channel can be read simultaneously. For example, a signal at channel 1 can be related to energy dissipation (loss), while the signal at channel 2 can be proportional to the magnetic susceptibility. In-phase and the ($\pi/2$) out-of-phase signals can be used to derive a real part (X') and an imaginary part (X") of the magnetic susceptibility of the sample. A transformer 150, such as a step-up transformer, can be used to amplify the signal supplied to the lock-in amplifier. A display 170 can be used to monitor the voltages u1, u2, u3 and u4 within the bridge circuit.

The sensing head and/or balancing heads can be ferrite heads (e.g., composite ferrite heads), ring heads, metal-in-gap heads (e.g., single-sided or double-sided heads), or thin film heads. Preferably, the head material is not magnetically saturated so that a magnetic field can be induced in the gap of each head which is proportionate to an applied signal amplitude generated by a power source, such as an oscillator.

The resolution of the susceptometer is a function of the geometry of the sensing head. In particular, the gap length, the gap width, the gap field strength, and the distance between the sensing head and the sample can affect the spatial resolution. Each head can have a gap length and a gap width of up to about 200 micrometers. A preferred gap is a square gap measuring less than 50×50 micrometers. For example, an exemplary embodiment head gap can be a rectangular gap, wherein a gap length is substantially parallel to the field direction and can be less than about 10 micrometers, while a gap width is substantially perpendicular to the field direction and can be less than about 100 micrometers for a predetermined desirable spatial resolution.

The strength of the interaction between a sensing head and a sample is a function of the strength of the gap field and the distance between the sensing head and the sample. The intensity of the sensing head's magnetic field decreases nearly exponentially with the distance away from the gap. Thus, the closer the sample is to the sensing head, the stronger and more localized the effect of the interaction.

Preferably, the sensing head scans at a constant height above a surface of the sample. The distance between the gap in the sensing head and the sample is preferably within an effective distance such that the magnetic susceptibility of the sample can be measured. During a measurement of the off balance voltage of a sample, for example, the sensing head can physically contact the sample surface or the sensing head can be positioned at a finite height above the sample surface. Typically, the distance between the gap of the sensing head and the sample surface is less than about 10 mm, or less than about 5 mm.

A second configuration for the bridge circuit is a 2-head geometry comprising two identical heads (e.g., identical ring heads). In the example of a 2-head geometry with identical ring heads, each head includes two coils. An exemplary basic circuit of a 2-head geometry is illustrated in FIG. 2.

Bridge circuit 210 can include two ring heads 220,226, wherein each ring head can include a pair of coils wound around magnetic cores 230,236. Ring head 220, as illustrated in FIG. 2, includes a primary coil 222 and a secondary coil 223, while ring head 226 also includes a primary coil 228 and a secondary coil 229, wherein the primary coils 222,228 form a primary set and the secondary coils 223,229 form a secondary set. As illustrated in FIG. 2, each magnetic core can be shaped to form a gap G, wherein head 220 is a sensing head and head 226 is a balancing head.

Figure 2:
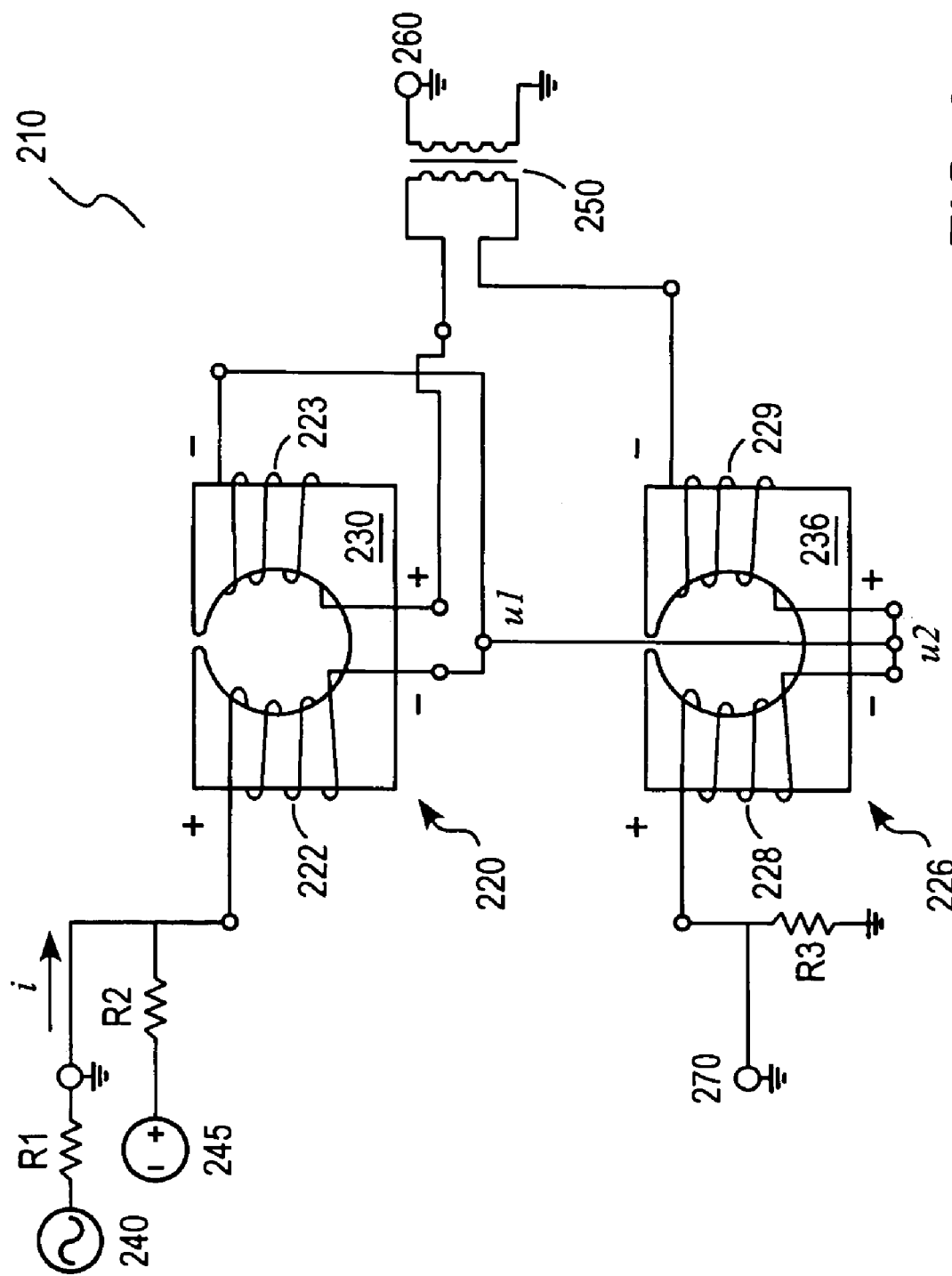
FIG. 2 is an illustration of the circuit diagram of a preferred embodiment of a 2-head bridge circuit.

In the 2-head configuration illustrated in FIG. 2, the two primary coils 222,228 can be connected in series or in parallel, and the two secondary coils 223,229 can be connected in series. The polarity of one winding in the circuit can be reversed to eliminate induction in the secondary set when there is an input to the primary set and no sample is proximate to the sensing head. This is illustrated in FIG. 2, where the polarity of one winding in sensing head 220 is switched. Specifically, the negative pole of primary coil 222 is connected to the negative pole of secondary coil 223, whereas the negative pole of primary coil 228 is connected to the positive pole of secondary coil 229.

As with the 4-head configuration, a bridge circuit of a 2-head configuration includes an AC power source (e.g., oscillator) 240 and an optional DC power source 245. Because the current limit for the sensing head in the 2-head configuration is half that of the current limit for the sensing head in the 4-head configuration, the maximum input current for the 2-head configuration (and hence the maximum gap field) is only half of the value for a 4-head configuration. Also, a transformer 250, such as a step-up transformer, can be used to amplify the imbalance voltage signal (u3-u4) supplied to lock-in amplifier 260. Additionally, a 2-head bridge circuit can further include resistors R1, R2 and R3 and a display 270, which can be used to monitor the values of u1 and u2 within the bridge circuit.

The two-head configuration advantageously has a reduced level of noise due to thermal drift in the coils compared to the four-head configuration previously described. This can be particularly advantageous in large area and/or long scans. The effect on thermal drift of converting from a 4-head configuration to a 2-head configuration is shown in FIGS. 3A-B and 4A-B.

To test the thermal drift response of both a 4-head and a 2-head configuration, a test sample with a printed pattern of magnetic ink ($\gamma$-$Fe_2O_3$-containing ink) on a glass plate can be imaged using a local susceptometer apparatus with the circuit configurations described previously. A sample area of approximately 8.25 mm×8.25 mm can be scanned using a step length of 0.05 mm.

Figure 3A:
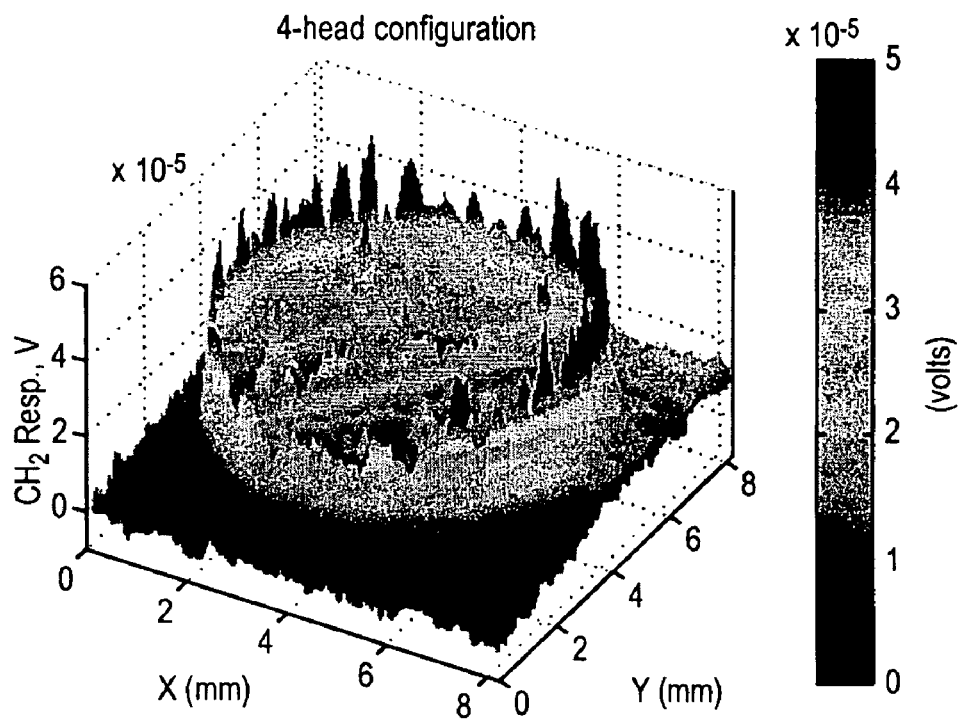
FIG. 3 shows local susceptometer data obtained using one embodiment of a 4-head bridge circuit susceptometer.
Figure 3B:
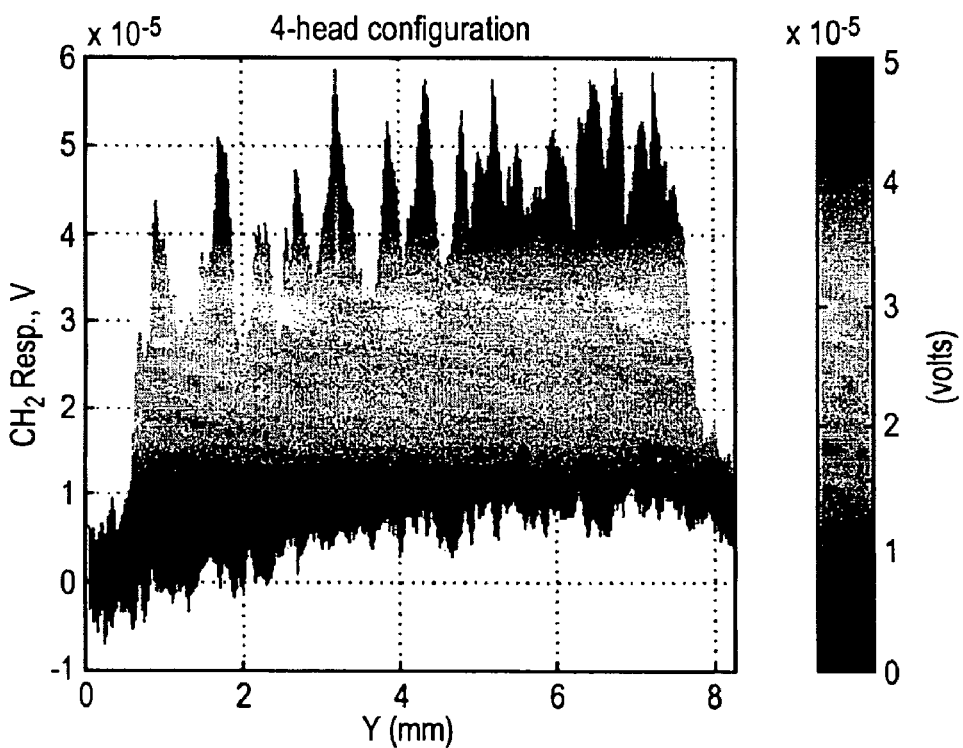
Figure 4A:
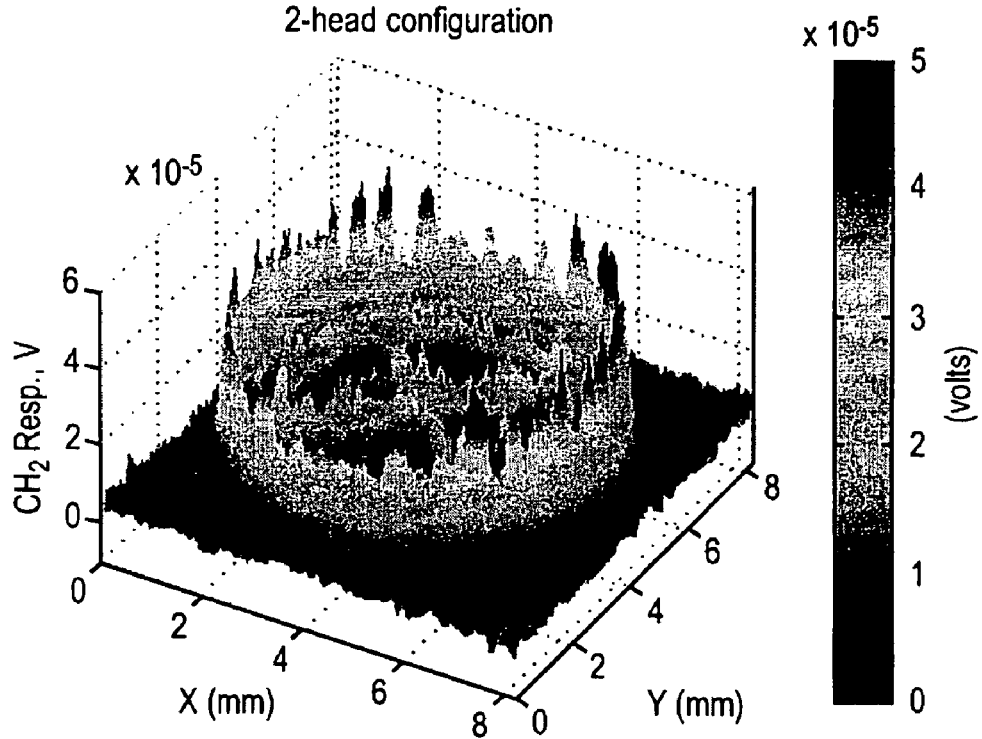
FIG. 4 shows local susceptometer data obtained using one embodiment of a 2-head bridge circuit susceptometer.
Figure 4B:
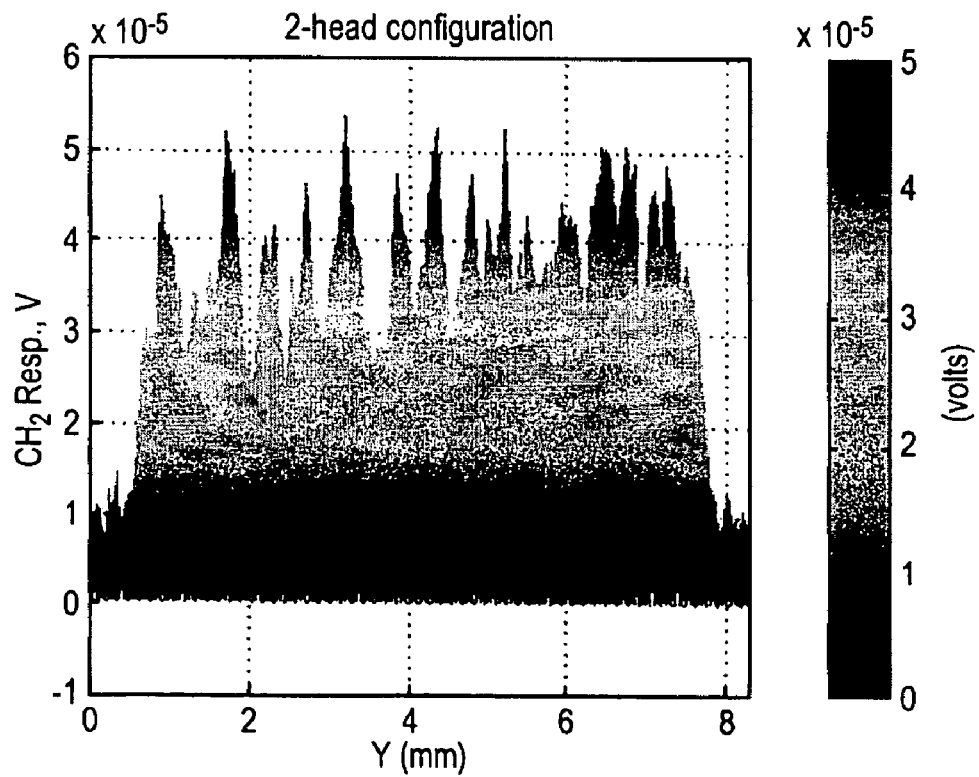

FIGS. 3A and 3B show local susceptometer data obtained using a 4-head configuration and FIGS. 4A and 4B show comparative data obtained using a 2-head configuration. In FIGS. 3A and 4A, a three-dimensional representation of the magnetic susceptibility is illustrated, wherein the x and y axes represent lateral (x and y) dimensions in millimeters on the sample surface and the z axis represents the in-plane magnetic responses. Thus, comparing the two-dimensional representations in FIGS. 3B and 4B, wherein the x-axis represents a trace across the sample surface (in millimeters) and the y axis, in volts, is proportional to the in-plane magnetic responses, shows that the susceptibility can be measured by either the 2-head or the 4-head configurations.

Additionally, the effect on thermal drift can be seen by comparing FIGS. 3B and 4B. A background drift (D) of approximately 10 micro-volts can be seen in the data of the 4-head configuration of FIG. 3B (see lower portion of FIG. 3B), while a substantially flat background response is obtained for the data of the 2-head configuration in FIG. 4B.

In the 4-head configuration, thermal drift can be derived from segments of the circuit having a resistance of several ohms. In the 2-head configuration, however, the thermal drift can be derived from the potential resistance change of a segment of the circuit having only milli-ohm resistance.

The susceptometer can be operated using a computer system 180. The computer system 180, which can be connected to the oscillator 140, stepper motors 189, sample stage 184, temperature controller 186, lock-in amplifier 160, data display 170, etc., can be adapted to control the power input to the bridge circuit, motion of the sensing head 120, sample stage 184 (e.g., sample stage temperature), as well as data acquisition and processing software. An IEEE-488 bus can be used to connect the various components in order to enable, for example, the computer and stepper motors to sequence and control the susceptibility measurement.

The computer system can control the voltage, current and frequency output of the oscillator. The computer system can control the movement of the sensing head, including translational and rotational movement for data collection, and retraction capabilities for background subtraction. The computer system can control the temperature of the sample stage or a temperature-controlled bath, if provided. The computer system, including data acquisition electronics, can process the perturbation signals received from the bridge circuit via the lock-in amplifier. Suitable algorithms can generate susceptibility maps, polar plots and/or anisotropy images, which can be transmitted to a display device. The display device may be, for example, a video monitor, plotter, printer and/or a chart recorder. Further algorithms can perform background subtraction routines and off-axis compensation (e.g., positioning of the gap field of the sensing head at a particular sample location).

The fringe field that interacts with a sample is typically a small fraction of the total flux passing through the gap in the sensing head. Thus, the imbalance voltage induced in the bridge circuit by a region of the sample is typically a small signal compared to the driving voltage. Furthermore, the local environment (i.e., temperature gradients and/or electromagnetic fields) can create a background signal that can adversely affect the susceptibility measurement.

As mentioned above, background subtraction can be used to minimize environmental effects. In an exemplary background subtraction scheme, a sensing head can be physically retracted (i.e., in the z direction) from the sample surface. In an embodiment, the sensing head is moved away from the sample, a background subtraction algorithm is run, and the sensing head is repositioned proximate to (or in contact with) the sample. A background subtraction algorithm can be run each time the sensing head is moved (i.e., translated or rotated) prior to measuring an induced response in the bridge circuit.

A magnetic shield can be used to minimize environmental effects. For example, a susceptometer 110 can include a shield 190 (e.g., electromagnetic shield) adapted to reduce or minimize distortions in an offset voltage due to external electromagnetic fields. The magnetic shield 190 can be formed of an electrically conductive material such as a metal. A preferred magnetic shield is a solid shield made of permalloy. The magnetic shield 190, which can be in the shape of a cup or dome, can shelter a sensing head 120, one or more balancing heads 122, 124, and 126, and a region of the sample 182 being measured from electromagnetic radiation, as desired.

An exemplary embodiment of a susceptometer can include a sensing head and three balancing heads mounted on an x-y stage with a gap region and a permalloy shell surrounds the x-y stage, the sensing head and the balancing heads. The balancing heads are preferably located remotely to the sensing head. That is, the balancing heads can be positioned such that there is no effective interaction between the balancing heads and the sample.

In embodiments having more than one balancing head, the balancing heads are preferably located in close physical proximity to each other. Thus, the environment sensed by one balancing head (e.g., the thermal environment and/or the electromagnetic environment) is substantially identical to the environment sensed by each of the other balancing heads.

As mentioned above, a sample can be moved relative to a susceptometer in order to map the local susceptibility of a surface of a sample. Alternatively, a sensing head of a susceptometer can be moved relative to a sample in order to map the local susceptibility of a surface, wherein an x-y stage can be adapted to translate the sensing head with respect to a surface of the sample over a sample area of up to about 100 cm$^2$ at a step size of less than about 1 micrometer.

According to a preferred embodiment, the sensing head is adapted to be rotated with respect to the sample. By changing the orientation of the sensing head with respect to a sample surface, in-plane anisotropy can be measured. For example, the sensing head 120 can be mounted on an axis and a motor 189 such as a stepper motor 189 can be used to control rotation of the axis. A stepper motor 189 can provide sensing head rotation capability with an angular increment of less than 2 degrees, preferably less than 1 degree.

Preferably, the gap of the sensing head is located on the axis of rotation of the sensing head such after each successive rotation of the sensing head the gap field (i.e., sensing region) of the sensing head interacts with substantially the same local region of the sample. Alignment software including an alignment algorithm can be used to position the gap field at a desired location of the sample (i.e., after a rotation of the sensing head).

For each location and/or orientation of the sensing head with respect to the sample, the susceptometer can generate an array of perturbation signals representative of the local disturbance to the bridge circuit.

The magnetic properties of a region of sample can be measured at room temperature or as a function of temperature. To measure temperature-dependant properties, the susceptometer can comprise a temperature-controlled sample stage or a temperature controlled bath that can be used to control the temperature of a sample. For example, a sample can be cooled by immersing the sample in a temperature controlled bath comprising a coolant such as liquid nitrogen.

The susceptometer can be used in a number of applications and for a number of different sample types. The unit can be used to quantify the effects of processing (e.g., heat treatments and physical deformation such as rolling, swaging, punching, machining, etc.) on metals and alloys such as electrical steels, iron aluminides, and hard and soft magnetic materials such as metallic glasses and glassy alloys. Electrical steels can be used in transformers, motors, generators, and other applications that call for electromagnetic components.

The susceptometer can be used, for example, to study the exchange bias in magneto-resistive reading heads used in computer hard drives, to study high frequency effects in thin film magnetic systems used as data recording media, to evaluate permanent magnetic materials such as neodymium-iron boride (e.g., $Nd_2Fe_{14}B$) and samarium cobalt (e.g., $Sm_5Co$) magnets, and to study high temperature superconductors. The unit can be used to investigate the intergranular and transgranular superconducting processes.

A preferred unit is portable (e.g., the unit can be a handheld unit 192 or a desk top unit) and in a preferred embodiment can be used to measure samples in the field. The unit can be used in wholesale, retail and other commercial applications, and in a preferred embodiment the unit can be used to read magnetic print (e.g., magnetic barcodes or other symbols) such as magnetic print that is printed on the package of a commercial product. The unit can be used in anti-counterfeiting applications, wherein, for example, the unit can verify the authenticity of a product bearing a magnetic code. A magnetic code can be incorporated into the packaging of a product as, for example, a magnetic bar code.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

We claim:

1. A local magnetic susceptibility unit for measuring the AC magnetic susceptibility of a surface region of a sample, comprising:
    a sensing element; and
    one or more balancing elements arranged in a circuit, wherein the sensing element comprises:
        a magnetic core having a leading arm;
        a trailing arm with a gap formed therebetween; and
        at least one coil wound around the magnetic core and operative to generate, upon connection to a power source, a magnetic field across the gap and to induce an imbalance voltage therein in response to an interaction between the magnetic field and a surface region of a sample,
    wherein the imbalance voltage is measured to determine a magnetic susceptibility of the surface region, wherein the sensing element is mounted on a stage to perform a motion of the sensing element with respect to the sample, the motion including translation and rotation.

2. The local magnetic susceptibility unit of claim 1, wherein the local magnetic susceptibility unit further comprises:
the power source adapted to energize the at least one coil to form a magnetic field across the gap of the sensing element; and
a phase sensitive detector adapted to measure the imbalance voltage.

3. The local magnetic susceptibility unit of claim 1, wherein:
the local magnetic susceptibility unit is one selected from the group consisting of a hand-held unit and a desk top unit.

4. The local magnetic susceptibility unit of claim 1, wherein the sensing element comprises a ferrite head, a ring head, a metal-in-gap head, or a thin film head.

5. The local magnetic susceptibility unit of claim 1, wherein:
the sensing element and the one or more balancing elements are substantially identical elements.

6. The local magnetic susceptibility unit of claim 1, wherein the gap of the sensing element is a single gap.

7. The local magnetic susceptibility unit of claim 1, wherein the gap has an area of less than 40,000 $\mu m^2$.

8. The local magnetic susceptibility unit of claim 1, wherein the sensing element and the one or more balancing elements are configured to form a primary set of coils and a secondary set of coils such that the voltage from the secondary set of coils is zero when an alternating current flows through the primary set of coils and the gap of the sensing element is not proximate to the surface region of a sample.

9. The local magnetic susceptibility unit of claim 1, wherein the sensing element and the one or more balancing elements are magnetically shielded.

10. The local magnetic susceptibility unit of claim 1, wherein the unit comprises a single balancing element having a first coil and a second coil, the sensing element comprises a first coil and a second coil, the first coil of the sensing element and the first coil of the balancing element are connected in series, and the second coil of the sensing element and the second coil of the balancing element are connected in series.

11. A method of measuring the in-plane AC magnetic susceptibility of a surface region of a sample using the local magnetic susceptibility unit of claim 1, comprising the steps of:
(i) passing an alternating electrical current through the coil of the local magnetic susceptibility unit of claim 1;
(ii) positioning a region of the sample proximate to the sensing element within a distance from the sensing element effective to induce a voltage perturbation in the coil; and
(iii) measuring the voltage perturbation.

12. The method of claim 11, wherein the voltage perturbation is measured using a phase sensitive detector.

13. The method of claim 11, further comprising shielding the sensing element and the one or more balancing elements while measuring the voltage perturbation.

14. A method of detecting magnetic features of at least a selected region of an object comprising:
(i) passing an alternating electrical current through the coil of the local magnetic susceptibility unit of claim 1;
(ii) positioning a region of the sample within a distance from the sensing element effective to induce a voltage perturbation in the coil; and
(iii) measuring the voltage perturbation.

15. The local magnetic susceptibility unit of claim 1, wherein the stage is a temperature-controlled stage.

16. The local magnetic susceptibility unit of claim 1, wherein the sensing element is separated from the one or more balancing elements to prevent an interaction therebetween.

17. The local magnetic susceptibility unit of claim 1, wherein the gap has an area of less than 1000 $\mu m^2$.

18. A local magnetic susceptibility unit for measuring the AC magnetic susceptibility of a surface region of a sample, comprising:
a sensing element;
one or more balancing elements arranged in a circuit, wherein the sensing element comprises:
a magnetic core having a leading arm;
a trailing arm with a gap formed therebetween; and
at least one coil wound around the magnetic core and operative to generate, upon connection to a power source, a magnetic field across the gap and to induce an imbalance voltage therein in response to an interaction between the magnetic field and a surface region of a sample,
wherein the imbalance voltage is measured to determine a magnetic susceptibility of the surface region; and
a computer system coupled to the power source, a motor for positioning the sensing element, a temperature controller for controlling a temperature of sample, and a lock-in amplifier and adapted to control at least one of the group consisting of
a power input to a circuit, a position of the sensing element, a temperature of the sample,
acquisition of AC magnetic susceptibility data, and processing of the data.

19. A local magnetic susceptibility unit for measuring the AC magnetic susceptibility of a surface region of a sample, comprising:
a sensing element;
one or more balancing elements arranged in a circuit, wherein the sensing element comprises:
a magnetic core having a leading arm;
a trailing arm with a gap formed therebetween; and
at least one coil wound around the magnetic core and operative to generate, upon connection to a power source, a magnetic field across the gap and to induce an imbalance voltage therein in response to an interaction between the magnetic field and a surface region of a sample,
wherein the imbalance voltage is measured to determine a magnetic susceptibility of the surface region,
wherein the unit comprises three balancing elements and the sensing element configured in a bridge circuit, each element comprising a single coil or a pair of coils connected in series via a center tap.

20. A method of measuring the in-plane AC magnetic susceptibility of a surface region of a sample using a local magnetic susceptibility unit comprising a sensing element, one or more balancing elements arranged in a circuit, wherein the sensing element comprises a magnetic core having a leading arm, a trailing arm with a gap formed therebetween, and at least one coil wound around the magnetic core and operative to generate, upon connection to a power source, a magnetic field across the gap and to induce an imbalance voltage therein in response to an interaction between the magnetic field and a surface region of a sample, wherein the imbalance voltage is measured to determine a magnetic susceptibility of the surface region, the method comprising measuring an in-plane anisotropy of the sample by:
(i) passing an alternating electrical current through the coil of the local magnetic susceptibility unit;
(ii) positioning a region of the sample proximate to the sensing element within a distance from the sensing element effective to induce a voltage perturbation in the coil;
(iii) measuring the voltage perturbation;
(iv) rotating the sensing element with respect to the sample;
(v) measuring a voltage perturbation in the coil; and
(vi) storing the voltage perturbation signal as a function of a rotational position of the sensing element.

21. The method of claim 20, further comprising positioning the sensing element at a distance from the sample ineffective to induce a voltage perturbation in the circuit and performing a background subtraction prior to step (iv).

22. The method of claim 20, further comprising: (vii) repeating steps (iv)-(vi).

23. A method of measuring the in-plane AC magnetic susceptibility of a surface region of a sample using a local magnetic susceptibility unit comprising a sensing element, one or more balancing elements arranged in a circuit, wherein the sensing element comprises a magnetic core having a leading arm, a trailing arm with a gap formed therebetween, and at least one coil wound around the magnetic core and operative to generate, upon connection to a power source, a magnetic field across the gap and to induce an imbalance voltage therein in response to an interaction between the magnetic field and a surface region of a sample, wherein the imbalance voltage is measured to determine a magnetic susceptibility of the surface region, the method comprising forming a map of the AC magnetic susceptibility by:
(i) passing an alternating electrical current through the coil of the local magnetic susceptibility unit;
(ii) positioning a region of the sample proximate to the sensing element within a distance from the sensing element effective to induce a voltage perturbation in the coil;
(iii) measuring the voltage perturbation;
(iv) storing the voltage perturbation signal as a function of an x and y position of the sensing element;
(v) changing the x position and/or the y position of the sensing element; and
(vi) repeating steps (i)-(v).

24. The method of claim 23, further comprising positioning the sensing element at a distance from the sample ineffective to induce a voltage perturbation in the circuit and performing a background subtraction prior to step (iv).

* * * * *